United States Patent [19]
Pan

[11] Patent Number: 5,750,435
[45] Date of Patent: May 12, 1998

[54] METHOD FOR MINIMIZING THE HOT CARRIER EFFECT IN N-MOSFET DEVICES

[75] Inventor: Yang Pan, Singapore, Singapore

[73] Assignee: Chartered Semiconductor Manufacturing Company Ltd., Singapore, Singapore

[21] Appl. No.: 892,336

[22] Filed: Jul. 14, 1997

Related U.S. Application Data

[63] Continuation of Ser. No. 507,144, Jul. 26, 1995, abandoned.

[51] Int. Cl.$^6$ ............................................. H01L 21/425
[52] U.S. Cl. ............................................. 438/525; 438/528
[58] Field of Search ......................... 437/24, 35, 28, 437/29; 438/525, 528

[56] References Cited

U.S. PATENT DOCUMENTS

| | | | |
|---|---|---|---|
| 5,108,935 | 4/1992 | Rodder | 437/24 |
| 5,155,369 | 10/1992 | Current | 250/492.2 |
| 5,223,445 | 6/1993 | Fuse | 437/24 |
| 5,270,227 | 12/1993 | Kameyama et al. | 437/35 |
| 5,308,780 | 5/1994 | Chou et al. | 437/35 |
| 5,346,841 | 9/1994 | Yajima | 437/35 |
| 5,360,749 | 11/1994 | Anjum et al. | 437/24 |
| 5,369,297 | 11/1994 | Kusunoki et al. | 257/411 |
| 5,372,957 | 12/1994 | Liang et al. | 437/35 |
| 5,496,751 | 3/1996 | Wei et al. | 437/35 |
| 5,516,707 | 5/1996 | Loh et al. | 437/24 |

OTHER PUBLICATIONS

Kuroi et al., Novel NICE (Nitrogen Implantation into CMOS Gate Electrode and Source-Drain) Structure for High Reliability and High Performance 0.25 um Dual Gate CMOS, IEDM 1993, IEEE, 13.2.1-13.2.4, pp. 325-328, 1993.

Wolf et al., "Silicon Processing for the VLSI Era", vol. II, Lattice Press, 1990, pp. 361-363.

*Primary Examiner*—Charles L. Bowers, Jr.
*Assistant Examiner*—Lynne A. Gurley
*Attorney, Agent, or Firm*—George O. Saile; Stephen B. Ackerman; Alek P. Szecsy

[57] ABSTRACT

An N-Channel Metal Oxide Semiconductor Field Effect Transistor (N-MOSFET) with minimum susceptibility to the Hot Carrier Effect (HCE) and a method by which the N-MOSFET is fabricated. Formed upon a semiconductor substrate is a N-MOSFET structure including a gate oxide upon a semiconductor substrate, a gate electrode upon the gate oxide and a pair of N+ source/drain regions adjoining the gate electrode and the gate oxide. Implanted into the gate oxide regions beneath the gate electrode edges is a dose of a hardening ion. The hardening ion may be either nitrogen ion or fluorine ion. The hardening ion is implanted at an angle non-orthogonal to the plane of the semiconductor substrate through means of a large tilt angle ion implant process. Optionally, a Lightly Doped Drain (LDD) source/drain electrode structure or Double Doped Drain (DDD) source/drain electrode structure may be incorporated into the N-MOSFET structure.

7 Claims, 2 Drawing Sheets

METHOD FOR MINIMIZING THE HOT CARRIER EFFECT IN N-MOSFET DEVICES

This application is a file wrapper continuation application of application Ser. No. 08/507,144, filed 26 Jul., 1995, now abandoned.

BACKGROUND OF THE INVENTION

1. Field of the Invention

The present invention relates to methods for minimizing Hot Carrier Effects (HCEs) within Metal Oxide Semiconductor Field Effect Transistor (MOSFET) devices. More particularly, the present invention relates to a large tilt angle ion implant method whereby gate oxide regions beneath gate electrode edges in N-Channel MOSFETs (N-MOSFETS) may be hardened against HCEs.

2. Description of Related Art

A Metal Oxide Semiconductor Field Effect Transistor (MOSFET) may be fabricated upon a semiconductor substrate through methods as are conventional in the art to form upon the semiconductor substrate a gate oxide upon which resides a gate electrode, and a pair of source/drain electrodes which adjoin the gate oxide and the gate electrode.

As semiconductor device technology has continued to advance, and dimensions of semiconductor devices have continued to decrease, several novel effects which degrade the performance of Metal Oxide Semiconductor Field Effect Transistors (MOSFETs) have become more pronounced. Among these novel effects is a phenomenon known as the Hot Carrier Effect (HCE). The HCE is manifested by drifts in transistor parameters such as current drive and threshold voltage. These drifts in device parameters derive from injection of charge carriers from the semiconductor substrate upon which is formed a MOSFET device into the gate oxide of the MOSFET device. The injected charge carriers may generate more interface states within the gate oxide or they may be trapped by mid-gap states of the gate oxide.

Several factors influence the magnitude of the HCE within MOSFET devices. These factors include the polarity of the MOSFET device, the hardness of the interface to the injected charge carriers, the trap density within the gate oxide, the potential barrier to charge carrier injection provided by the semiconductor substrate/gate oxide interface and the electric field formed within the MOSFET device. With regard to electric field, the HCE is typically manifested most strongly within semiconductor substrate and gate oxide regions which reside beneath the gate electrode edges of a MOSFET device. At these semiconductor substrate and gate oxide regions, the electric field needed to inject charge carriers from the semiconductor substrate into the gate oxide is usually most intensified. In addition, the HCE is also typically enhanced in advanced semiconductor devices where gate length dimensions have decreased while MOSFET operating voltages have remained constant. Under these conditions the electric field at semiconductor substrate and gate oxide regions beneath gate electrode edges is also unusually intense. Thus, it is towards the control of HCEs at semiconductor substrate and gate oxide regions beneath gate electrode edges within MOSFET devices that the present invention is generally directed.

Methods through which the HCE within MOSFET devices has conventionally been controlled have included the use of ion implant processes to modify semiconductor substrate regions beneath gate electrode edges where the electric field which injects charge carriers into the gate oxide overlying the semiconductor substrate is at its maximum. These ion implant processes have typically included multiple ion implants designed to form into a semiconductor substrate a graded junction from a lightly doped semiconductor substrate region at the location of high electric field beneath the gate electrode edges of a MOSFET device to a heavily doped semiconductor substrate region at the remote source/drain electrode regions of the MOSFET device. When formed in this fashion, graded junctions will typically minimize or eliminate the HCE within MOSFET devices.

Specific methods which have been used to provide the graded semiconductor substrate junction desirable for control of the HCE within MOSFET devices include: (1) the Lightly Doped Drain (LDD) method whereby two partially overlapping ion implants at substantially different ion implant doses are provided into a semiconductor substrate to yield a lightly doped semiconductor substrate region beneath the gate electrode edges and a heavily doped semiconductor substrate region forming the remote source/drain electrodes, and (2) the Doubly Doped Drain (DDD) method whereby two different dopant ions of substantially different diffusivity are implanted into the same region of the semiconductor substrate and thermally annealed to provide the graded junction which includes the highly doped source/drain electrodes and the lightly doped semiconductor substrate region beneath the gate electrode edges. It is a specific object of the present invention to provide an ion implant method which serves as an alternative and/or adjunct method to the Lightly Doped Drain and Doubly Doped Drain methods for control of the HCE within MOSFET devices.

In addition to the Lightly Doped Drain and Doubly Doped Drain ion implant methods for forming graded semiconductor substrate junctions which minimize the HCE within MOSFET devices, several other ion implant methods have been disclosed in the art, which ion implant methods provide novel ion implant structures directed towards semiconductor device performance concerns other than the HCE. For example, Yajima, in U.S. Pat. No. 5,346,841 describes a method for forming an isolation film surrounding a semiconductor device by means of non-orthogonally implanting oxygen ions into a semiconductor substrate. The isolation film is formed by simultaneously rotating the semiconductor substrate into which the oxygen ions are implanted while adjusting the energy and dose of the oxygen ions. Another example is disclosed by Current, in U.S. Pat. No. 5,155,369. Current discloses a multiple dose, non-orthogonal ion implant process whereby channeling effects in semiconductor substrates may be avoided.

In addition, Liang, in U.S. Pat. No. 5,372,957 discloses a non-conventional method for forming Lightly Doped Drain ion implant structures within semiconductor substrates. The method employs multiple ion implants provided non-orthogonally into the source/drain region of a semiconductor substrate. Finally, Anjum, in U.S. Pat. No. 5,360,749 discloses a method for minimizing Short Channel Effects (SCEs) within MOSFET devices. The disclosed method describes a non-orthogonal implant of germanium ions into selected semiconductor substrate regions.

Desirable in the art is a method whereby the concepts upon which these novel ion implant processes are based may be applied to provide methods alternative and/or adjunct to Lightly Doped Drain and Doubly Doped Drain methods for minimizing the HCE within MOSFET devices.

SUMMARY OF THE INVENTION

An object of the present invention is to provide a novel ion implant method which serves as an alternative and/or adjunct method to the Lightly Doped Drain and Doubly Doped Drain methods for minimizing the HCE within MOSFET devices.

A second object of the present invention is to provide an ion implant method in accord with the first object of the present invention, which method is also readily manufacturable.

A third object of the present invention is to provide an ion implant method in accord with the first object of the present invention and the second object of the present invention, which method is also economical.

In accord with the objects of the present invention, an ion implant method which provides an alternative and/or adjunct method for minimizing the HCE within N-MOSFETs is disclosed along with the N-MOSFET structure that results from that ion implant method. To fabricate the N-MOSFET of the present invention there is formed upon a semiconductor substrate a field effect transistor structure comprising a gate oxide upon which resides a gate electrode, adjoining which gate oxide and gate electrode are formed a pair of N+ source/drain electrodes within the semiconductor substrate. There is implanted into the gate oxide regions beneath the gate electrode edges a dose of a hardening ion. The hardening ion is implanted at an angle non-orthogonal to the plane of the semiconductor substrate through means of a large tilt angle ion implant process. The hardening ion is chosen from the group of hardening ions consisting of nitrogen ions and fluorine ions. After the gate oxide has been implanted with the dose of hardening ion, the semiconductor substrate is annealed.

The method of the present invention provides a novel alternative and/or adjunct method to Lightly Doped Drain and Doubly Doped Drain ion implant methods for minimizing the HCE within N-MOSFET devices. Through the method of the present invention, hardening ions are implanted at a non-orthogonal angle into the gate oxide regions beneath the gate electrode edges of an N-MOSFET device. By implanting hardening ions into the gate oxide regions beneath the gate electrode edges of the N-MOSFET device of the present invention the gate oxide regions will be hardened and the gate oxide/semiconductor substrate interface will provide a higher threshold energy for formation of new interface states due to the injected charge carriers from the semiconductor substrate.

The method of the present invention is applicable only to N-MOSFET devices, since within N-MOSFET devices a major feature controlling the HCE is the threshold to generate new interface states provided by the interfacial characteristics of the gate oxide and semiconductor substrate regions located beneath the gate electrode edges of the N-MOSFET. The method of the present invention is not preferred for P-MOSFET devices, since within those devices the magnitude of the HCE has typically been more closely related to the density of trap locations within the gate oxide. By implanting hardening ions into the gate oxide regions located beneath the gate electrode edges of an N-MOSFET, the HCE within the N-MOSFET may be minimized. Although the implant of hardening ions may also increase the trap density within regions of the gate oxide which are implanted with those hardening ions, the overall trap density within the gate oxide beneath a gate electrode of an N-MOSFET is not substantially increased since only the gate oxide regions beneath gate electrode edges of the N-MOSFET are implanted with hardening ions.

The method of the present invention is readily manufacturable. The method of the present invention provides a non-orthogonal implant of hardening ions into gate oxide regions located beneath the gate electrode edges of an N-MOSFET. Non-orthogonal implants of ions into and through semiconductor substrates are known in the art. Such processes are readily manufacturable.

The method of the present invention is economical. The method of the present invention provides for a non-orthogonal implant of hardening ions into gate oxide regions located beneath the gate electrode edges of an N-MOSFET. When used as an alternative to a Lightly Doped Drain or Doubly Doped Drain ion implant structure for an N-MOSFET device, the method of the present invention provides limited, if any, additional process complexity to the manufacturing process for that N-MOSFET device. When employed as an adjunct to the Lightly Doped Drain or Doubly Doped Drain ion implant structure for an N-MOSFET device, the method of the present invention provides only a single additional ion implant process to the manufacture of that device. Thus, the method of the present invention is economical in producing N-MOSFET devices which have minimal susceptibility to the HCE.

BRIEF DESCRIPTION OF THE DRAWINGS

The following drawings, which form a material part of this application, show the following.

DESCRIPTION OF THE PREFERRED EMBODIMENTS

The present invention provides an N-Channel Metal Oxide Semiconductor Field Effect Transistor N-MOSFET device and a method by which that N-MOSFET device may be manufactured, which N-MOSFET device possesses limited susceptibility to the Hot Carrier Effect (HCE). The method of the present invention may be used as an alternative or as an adjunct to the Lightly Doped Drain and the Doubly Doped Drain methods for limiting the HCE within N-MOSFET devices.

The method of the present invention employs a non-orthogonal ion implant process by which hardening ions are implanted into gate oxide regions beneath the gate electrode edges of an N-MOSFET device. The non-orthogonal ion implant process employs a hardening ion which modifies the gate oxide and semiconductor substrate interface to provide a higher threshold for the formation of interface states due to injection of charge carriers into gate oxide regions from semiconductor substrate regions beneath gate electrode edges. Through this method, the HCE is minimized in N-MOSFET devices wherein the present invention is practiced.

The method of the present invention may be employed in any N-MOSFET device which is susceptible to the HCE due to charge carrier injection from semiconductor substrate regions into gate oxide regions beneath gate electrode edges. The method of the present invention may be practiced upon N-MOSFET devices within integrated circuits including but not limited to Dynamic Random Access Memory (DRAM) integrated circuits, Static Random Access Memory (SRAM) integrated circuits and Application Specific Integrated Circuits (ASICs). The method of the present invention has broad applicability within N-MOSFET devices within integrated circuits.

Referring now to FIG. 1a to FIG. 1e, there is shown a series of cross-sectional schematic diagrams which illustrate progressive stages in the fabrication of an N-MOSFET in accord with the preferred embodiment of the present invention. Shown in FIG. 1a a schematic cross-sectional diagram illustrating the early stages in formation of an N-MOSFET.

Figure 1A:
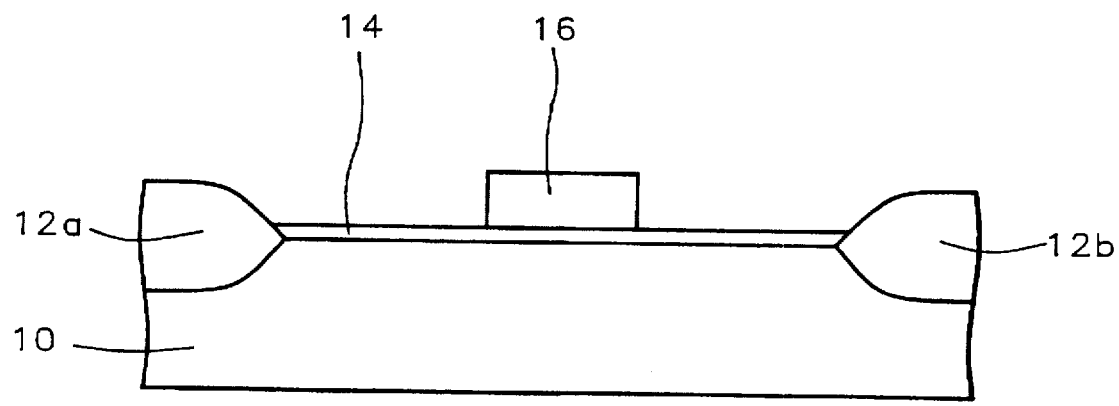
FIG. 1a to FIG. 1e show schematic cross-sectional diagrams illustrating an N-Channel Metal Oxide Semiconductor Field Effect Transistor (N-MOSFET) formed in accord with the preferred embodiment of the present invention.

Shown in FIG. 1a is a semiconductor substrate 10 within and upon whose surface is formed isolation regions 12a and 12b which define the active region of the semiconductor substrate 10. Although the present invention may be practiced upon semiconductor substrates of various dopant concentrations, either dopant polarity and various crystallographic orientations, the present invention is typically practiced upon a P- or N- semiconductor substrate having a (100) crystallographic orientation.

Isolation regions may in general be formed upon a semiconductor substrate through methods including but not limited to methods whereby portions of the semiconductor substrate exposed through a suitable mask are thermally oxidized to form isolation regions and methods whereby a suitable insulating material is formed upon the surface of the semiconductor substrate and patterned to form isolation regions. For the preferred embodiment of the present invention, the isolation regions 12a and 12b are preferably formed through a LOCal Oxidation of Silicon (LOCOS) process whereby portions of the semiconductor substrate 10 exposed through a suitable mask are oxidized to form isolation regions 12a and 12b.

Also shown in FIG. 1a is a gate oxide 14 formed upon the active region of the semiconductor substrate 10, and a gate electrode 16 formed upon the gate oxide 14. Methods through which both gate oxides and gate electrodes may be formed are conventional to the art. Gate oxides may be formed through methods including but not limited to methods whereby the surface of the active region of a semiconductor substrate is oxidized to form a gate oxide, and methods whereby a layer of gate oxide material is deposited upon the surface of the active region of a semiconductor substrate. Gate electrodes are typically formed upon gate oxides via patterning through methods as are conventional in the art of a blanket layer of gate electrode material. Typical gate electrode materials include but are not limited to metals, metal alloys, highly doped polysilicon and polycides (polysilicon/metal silicide stacks).

For the preferred embodiment of the present invention, the gate oxide 14 is preferably formed upon the semiconductor substrate 10 through a thermal oxidation process whereby the surface of the active region of the semiconductor substrate 10 is oxidized to form the gate oxide 14. The thickness of the gate oxide 14 is preferably about 20 to about 200 angstroms. For the preferred embodiment of the present invention, the gate electrode 16 is preferably formed upon the surface of the gate oxide 14 via patterning through methods as are conventional in the art of a highly doped polysilicon layer. The thickness of the highly doped polysilicon layer and the gate electrode 16 patterned from the highly doped polysilicon layer is preferably about 1000 to about 5000 angstroms.

Figure 1B:
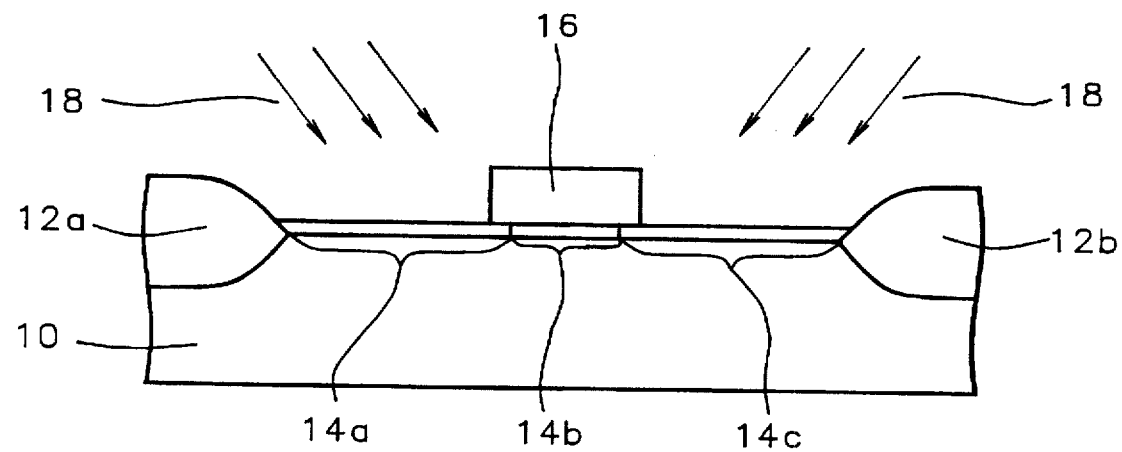

Referring now to FIG. 1b there is shown the next series of process steps in forming the N-MOSFET device in accord with the preferred embodiment of the present invention. Shown in FIG. 1b is the presence of hardening ions 18 which are implanted into the gate oxide 14 regions beneath the gate electrode 16 edges of the N-MOSFET of the present invention. The implanting of the hardening ions 18 into the gate oxide 14 beneath the gate electrode 16 edges is the process step critical to the present invention. In addition to implanting hardening ions 18 into the gate oxide 14 regions beneath the gate electrode 16 edges, the process through which the hardening ions 18 are implanted also provides hardening ions 18 into the exposed surfaces of the gate electrode 16, the exposed surfaces of the gate oxide 14 and the upper surface of the semiconductor substrate 10.

For the preferred embodiment of the critical hardening ion 18 implant process step of the present invention, either nitrogen or fluorine ions may be employed as the hardening ions 18. When nitrogen ions are employed as the hardening ions 18, the nitrogen ions are provided at: (1) a tilt angle of about 7 to about 60 degrees from an axis orthogonal to the plane of the semiconductor substrate 10, (2) an ion implantation dose of about 1E14 to about 1E16 ions per square centimeter, and (3) an ion implantation energy of about 5 to about 50 keV. When fluorine ions are employed as the hardening ions 18, the fluorine ions are provided at: (1) a tilt angle of about 7 to about 60 degrees from an axis orthogonal to the plane of the semiconductor substrate 10, (2) an ion implantation dose of about 1E14 to about 1E16 ions per square centimeter, and (3) an ion implantation energy of about 5 to about 50 keV. The hardening ions 18 are preferably provided into the gate oxide 14 regions beneath the gate electrode 16 edges by tilting the semiconductor substrate 10 to the prescribed tilt angle with respect to the hardening ions 18 and rotating the semiconductor substrate 10.

Subsequent to implanting the hardening ions 18 into the gate oxide 14 beneath the gate electrode 16 edges, the semiconductor substrate 10 is annealed. Several methods may be used to anneal the semiconductor substrate 10, including but not limited to thermal methods, Rapid Thermal Processing (RTP) methods and laser assisted processing methods. For the preferred embodiment of the present invention, the semiconductor substrate 10 is preferably annealed through a thermal method at a temperature of about 800 to about 950 degrees centigrade for a time period of about 5 to about 100 minutes.

When either nitrogen or fluorine ions are provided as the hardening ions 18, regions of the gate oxide 14 beneath the gate electrode 16 edges become hardened through either, respectively, nitridation or fluoridation. The nitrided or fluorided gate oxide 14 provides a higher threshold energy to generate interface states by injected charge carriers than equivalent gate oxide 14 regions which are neither nitrided or fluorided. For regions of the gate oxide 14 and semiconductor substrate 10 which reside beneath the gate electrode 16 edge, the hardening of the gate oxide 14 provides a semiconductor substrate 10/gate oxide 14 interface having a higher threshold to generate interface states due to injection of charge carriers than equivalent interfaces which have not been hardened. Thus, the HCE is minimized at those locations through practice of the present invention. Upon completion of the critical process of implanting hardening ions 18, the gate oxide 14 will be modified to form three separate gate oxide layers. Hardened gate oxide layers 14a and 14c will extend from the edges of the isolation regions 12a and 12b, respectively, inwardly terminating underneath opposite edges of the gate electrode 16. Unhardened gate oxide layer 14b remains centered beneath the gate electrode 16 upon the semiconductor substrate 10.

The method of the present invention is applicable only to N-MOSFET devices, since within N-MOSFET devices a major feature controlling the HCE is the threshold energy for formation of interface states to injection of charge carriers provided by the interfacial characteristics of the gate oxide and the semiconductor substrate regions located beneath the gate electrode edges of an N-MOSFET device. The method of the present invention is not preferred for P-MOSFET devices, since within those devices the magnitude of the HCE has typically been more closely related to the density of trap locations within the gate oxide. By implanting hardening ions into the gate oxide regions located beneath the gate electrode edges of an N-MOSFET, the HCE within the N-MOSFET may be minimized. Although the implant of hardening ions may also increase the trap density within regions of the gate oxide which are implanted with those hardening ions, the overall trap density within the gate oxide residing beneath the gate electrode is not substantially increased since only the gate oxide regions beneath gate electrode edges are implanted with hardening ions.

Figure 1C:
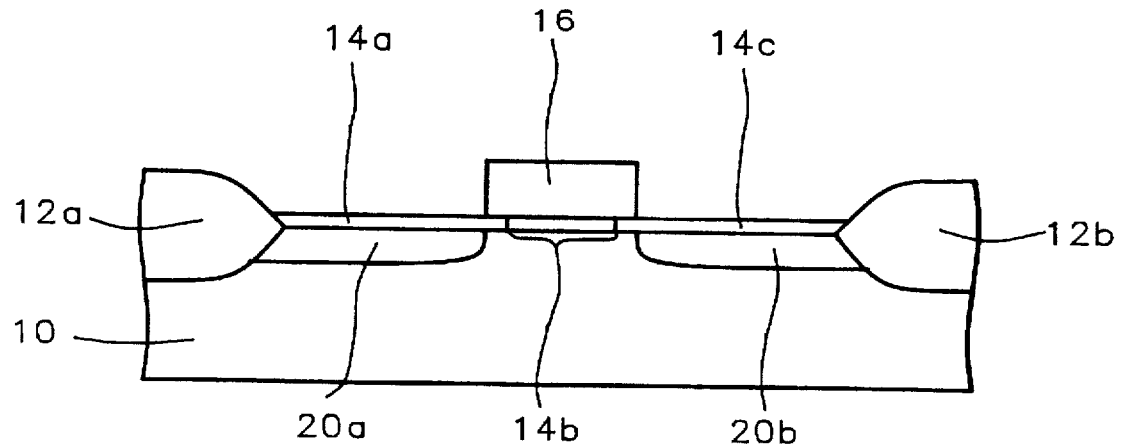

Referring now to FIG. 1c there is shown a schematic cross-sectional diagram illustrating the next series of process steps in forming an N-MOSFET in accord with the preferred embodiment of the present invention. Shown in FIG. 1c is the presence of low dose ion implants 20a and 20b in the active region of the semiconductor substrate 10 at locations other than those occupied by the gate electrode 16. These low dose ion implants 20a and 20b are part of a Lightly Doped Drain source/drain region structure within the semiconductor substrate 10. Although the Lightly Doped Drain source/drain region structure is not required for performance of the preferred embodiment of the present invention, the presence of a Lightly Doped Drain source/drain region structure further assures minimal sub-threshold currents within N-MOSFETs within which the method of the present invention is practiced. As an alternative to the Lightly Doped Drain source/drain region structure of the preferred embodiment of the present invention, a Double Doped Drain source/drain region structure may also be employed to assure minimal sub-threshold currents within N-MOSFET devices of the present invention.

Although low dose ion implants may in general be provided through several dopant ions, the low dose ion implants 20a and 20b for the preferred embodiment of the present invention must be provided through N dopant ions, typically chosen from the group of N dopant ions including but not limited to arsenic dopant ions and phosphorus dopant ions. For the preferred embodiment of the present invention the preferred N dopant ion is phosphorus ion, preferably implanted into the semiconductor substrate 10 at about 1E13 to about 1E14 ions per square centimeter ion implantation dose and about 15 to about 100 keV ion implantation energy to form the low dose ion implants 20a and 20b.

Figure 1D:
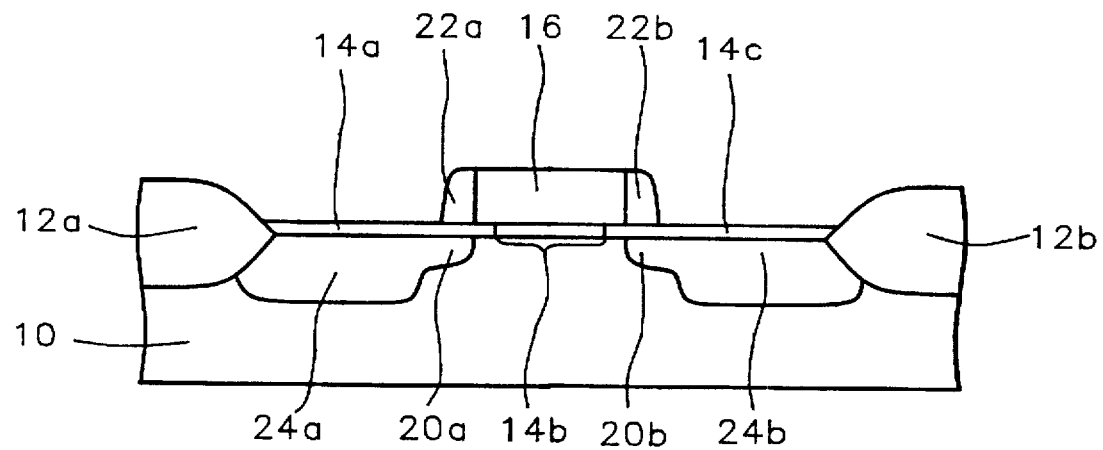

Referring now to FIG. 1d, there is shown a schematic cross-sectional diagram illustrating the next series of process steps in forming an N-MOSFET in accord with the preferred embodiment of the present invention. Shown in FIG. 1d is the presence of gate electrode spacers 22a and 22b at the opposite edges of the gate electrode 16. The gate electrode spacers 22a and 22b provide a method for defining the locations of the active semiconductor substrate region wherein the heavily doped source/drain regions 24a and 24b are formed.

Gate electrode spacers may be formed through methods including but not limited to Reactive Ion Etch (RIE) etching methods whereby a blanket layer of gate electrode spacer material formed upon the surface of a semiconductor substrate is etched to leave remaining gate electrode spacers. Blanket layers of gate electrode spacer materials may be formed from materials including but not limited to insulating materials such as silicon oxides, silicon nitrides and silicon oxynitrides. These blanket layers of gate electrode spacer materials may be formed upon semiconductor substrates through methods including but not limited to Chemical Vapor Deposition (CVD) methods, Plasma Enhanced Chemical Vapor Deposition (PECVD) methods and Physical Vapor Deposition (PVD) methods.

For the preferred embodiment of the present invention the gate electrode spacers 22a and 22b are preferably formed through Reactive Ion Etch (RIE) etching of a blanket layer of gate electrode spacer material formed of either a silicon oxide or a silicon nitride. An etchant composition is chosen appropriate to the gate electrode spacer material.

Also shown in FIG. 1d are the source/drain regions 24a and 24b which are formed into the semiconductor substrate 10 partially overlapping the locations of the low dose ion implants 20a and 20b. The corresponding source/drain region and low dose ion implant pairs 24a and 20a, and 24b and 20b form the Lightly Doped Drain source/drain region structure of the preferred embodiment of the present invention.

Although source/drain regions may in general be formed through implanting several types of dopant ions into a semiconductor substrate through methods as are conventional in the art, the polarity of the dopant ions employed in forming the source/drain regions 24a and 24b of the preferred embodiment of the present invention is dictated by the polarity of the N-MOSFET device upon which the present invention is practiced. Choices for the dopant ions are therefore limited to N polarity dopant ions including but not limited to arsenic dopant ions and phosphorus dopant ions. Thus, for the preferred embodiment of the present invention, the source/drain regions 24a and 24b are preferably formed through an ion implantation process as is conventional in the art employing as the dopant ion arsenic ion at about 1E15 to about 5E15 ions per square centimeter dose and about 20 to about 80 keV ion implantation energy. Subsequent to forming the source/drain regions 24a and 24b into the semiconductor substrate 10, the semiconductor substrate 10 is annealed to recrystallize the source/drain regions 24a and 24b.

Similarly to the annealing process employed for annealing the hardened gate oxide layers 14a and 14b, annealing of the source/drain regions 24a and 24b may also be accomplished through thermal methods, Rapid Thermal Processing (RTP) methods and laser assisted methods. For the preferred embodiment of the present invention, the semiconductor substrate is preferably annealed through a thermal method at a temperature of about 800 to about 950 degrees centigrade and a time period of about 5 to about 100 minutes to form the recrystallized source/drain regions 24a and 24b.

Figure 1E:
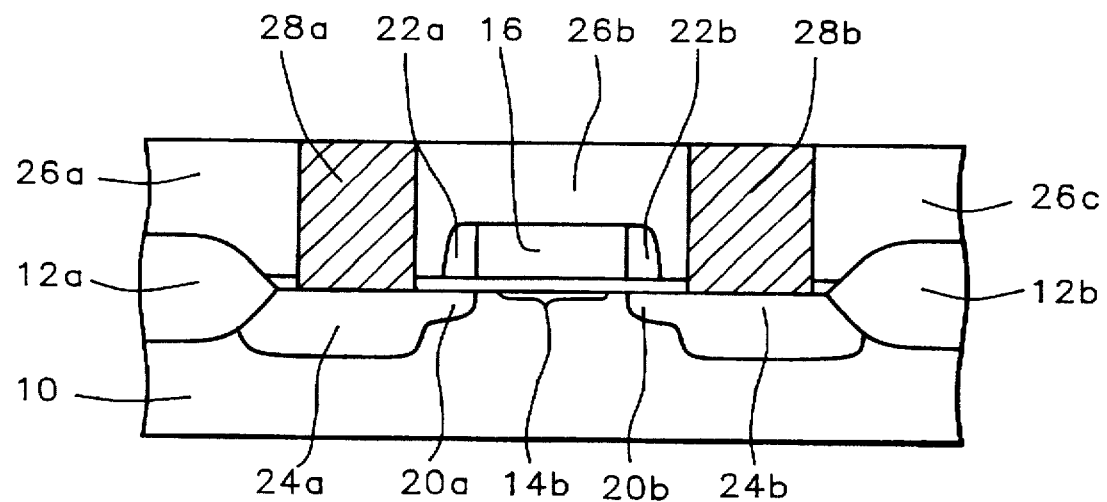

Referring now to FIG. 1e there is shown a cross-sectional schematic diagram illustrating the last series of process steps in forming an N-MOSFET in accord with the preferred embodiment of the present invention. Shown in FIG. 1e is the presence of patterned interlevel dielectric layers 26a, 26b and 26c. Patterned interlevel dielectric layers 26a, 26b and 26c are formed via patterning through photolithographic and etching methods as are known in the art of a blanket interlevel dielectric layer formed upon the semiconductor substrate 10. Blanket interlevel dielectric layers may be formed from insulating materials including but not limited to silicon oxides, silicon nitrides and silicon oxynitrides. These insulating layers may be formed upon semiconductor substrates through methods including but not limited to Chemical Vapor Deposition (CVD) methods, Plasma Enhanced Chemical Vapor Deposition (PECVD) methods and Physical Vapor Deposition (PVD) methods.

For the preferred embodiment of the present invention, the patterned interlevel dielectric layers 26a, 26b and 26c are preferably formed through patterning via photolithographic and etching methods as are known in the art of a blanket interlevel dielectric layer formed from a silicon oxide material deposited upon the semiconductor substrate 10 through a Chemical Vapor Deposition (CVD) process employing Tetra Ethyl Ortho Silicate (TEOS) as the silicon source material. Although insulating layers formed through other methods and materials may also be employed, the preferred method and material provide a simple and well known process conventional to the art. The bottoms of the apertures between the patterned interlevel dielectric layers 26a and 26b and the patterned interlevel dielectric layers 26b and 26c are etched through the hardened gate oxide layers 14a and 14c, respectively to expose surfaces of the source/drain regions 24a and 24b, respectively.

Finally, there is shown in FIG. 1e the presence of conductive contact studs 28a and 28b which are formed respectively into the apertures between the patterned interlevel dielectric layers 26a and 26b and the patterned interlevel dielectric layers 26b and 26c. Conductive contact studs within semiconductor devices are conventional to the art. They may be formed from conductive materials including but not limited to metals, metal alloys and polysilicon deposited upon a semiconductor substrate through methods including but not limited to thermal evaporation methods, electron beam assisted evaporation methods, and Chemical Vapor Deposition (CVD) methods. For the preferred embodiment of the present invention, the conductive contact studs 28a and 28b are preferably formed from a thin titanium nitride barrier layer of thickness about 200 to about 1000 angstroms upon which is formed thicker conductive tungsten layer. The tungsten layer is of sufficient thickness to completely fill the apertures within the interlevel dielectric layers 26a, 26b and 26c. The conductive contact studs 28a and 28b make contact, respectively, with the source/drain regions 24a and 24b.

Upon forming the conductive contact studs 28a and 28b within the patterned interlevel dielectric layers 26a, 26b and 26c, there is formed an N-MOSFET of the preferred embodiment of the present invention within an integrated circuit, which N-MOSFET possesses maximum immunity to device parameter drift, such as current drive drift and threshold voltage drift, due to the HCE. As is understood by persons skilled in the art, the foregoing description of the preferred embodiment of the present invention is a presently preferred embodiment which is not intended to limit this invention. Various modifications may be made to each and every processing step as are obvious to a person skilled in the art to provide additional embodiments which are within the spirit and scope of the present invention.

What is claimed is:

1. A method for minimizing the Hot Carrier Effect (HCE) within N-Channel Metal Oxide Semiconductor Field Effect Transistors (N-MOSFETs) comprising:

forming upon a semiconductor substrate a field effect transistor structure comprising a gate oxide, a gate electrode formed upon the gate oxide and a pair of N+ source/drain regions formed within the semiconductor substrate;

implanting into the gate oxide regions beneath the gate electrode edges a dose of a hardening ion, the hardening ion comprising fluorine only, the dose of the hardening ion being implanted at a tilt angle non-orthogonal to the plane of the semiconductor substrate, the dose of the hardening ion being implanted through means of a large tilt angle ion implant process, the dose of the hardening ion being sufficient to provide an increased threshold for formation of interface states due to charge carriers injected from the semiconductor substrate into the gate oxide; and annealing the semiconductor substrate.

2. The method of claim 1 wherein the gate oxide thickness is about 20 to about 200 angstroms.

3. The method of claim 2 wherein the tilt angle is about 7 to about 60 degrees from an axis orthogonal to the plane of the semiconductor substrate.

4. The method of claim 1 wherein the dose of the hardening ion is implanted at an ion implantation dose of about 1E14 to about 1E16 ions per square centimeter and an ion implantation energy of about 5 to about 50 keV.

5. The method of claim 1 wherein the semiconductor substrate is annealed at a temperature of about 800 to about 950 degrees centigrade for a time period of about 5 to about 100 minutes.

6. The method of claim 1 further comprising forming a Lightly Doped Drain source/drain region structure within the semiconductor substrate adjoining the gate electrode.

7. The method of claim 1 further comprising forming a Double Doped Drain (DDD) source/drain region structure within the semiconductor substrate adjoining the gate electrode.

* * * * *